(12) United States Patent
Choi et al.

(10) Patent No.: US 11,682,610 B2
(45) Date of Patent: Jun. 20, 2023

(54) SEMICONDUCTOR PACKAGE WITH HEAT RADIATION BOARD

(71) Applicant: JMJ Korea Co., Ltd., Bucheon-si (KR)

(72) Inventors: Yun Hwa Choi, Bucheon-si (KR); Younghun Kim, Incheon (KR); Jeonghun Cho, Goyang-si (KR)

(73) Assignee: JMJ Korea Co., Ltd., Bucheon-si (KR)

( * ) Notice: Subject to any disclaimer, the term of this patent is extended or adjusted under 35 U.S.C. 154(b) by 398 days.

(21) Appl. No.: 17/105,630

(22) Filed: Nov. 27, 2020

(65) Prior Publication Data

US 2021/0249342 A1    Aug. 12, 2021

(30) Foreign Application Priority Data

Feb. 7, 2020 (KR) .......... 10-2020-0014632

(51) Int. Cl.
*H01L 23/495* (2006.01)
*H01L 23/498* (2006.01)

(52) U.S. Cl.
CPC .. *H01L 23/49568* (2013.01); *H01L 23/49513* (2013.01); *H01L 23/49861* (2013.01); *H01L 23/49524* (2013.01)

(58) Field of Classification Search
CPC ......... H01L 23/49568; H01L 23/49513; H01L 23/49861; H01L 23/49524; H01L 23/3735; H01L 23/4334; H01L 23/49579; H01L 23/49562; H01L 2224/0603; H01L 2224/32145; H01L 2224/48247; H01L 2224/4903; H01L 2224/49111; H01L 2224/73265; H01L 2924/181; H01L 23/142; H01L 23/3736; H01L 23/49541; H01L 23/49838; H01L 23/49866; H01L 2224/32245; H01L 2924/00012

USPC .......................................... 257/668
See application file for complete search history.

(56) References Cited

U.S. PATENT DOCUMENTS

| 2010/0123240 A1* | 5/2010 | Sato ............ H01L 24/91 257/692 |
| 2010/0289127 A1* | 11/2010 | Kanazawa ....... H01L 24/97 257/666 |
| 2015/0243576 A1* | 8/2015 | Miyakoshi ....... H01L 23/473 361/717 |

FOREIGN PATENT DOCUMENTS

| CN | 104715807 A | * | 6/2015 | ........ B22F 1/052 |
| CN | 105678720 A | * | 6/2015 | ........ H01L 23/3737 |
| JP | H10-261744 A | | 9/1998 | |
| KR | 10-2001-0111736 A | | 12/2001 | |
| KR | 10-0685253 B1 | | 2/2007 | |

(Continued)

*Primary Examiner* — Alexander O Williams
(74) *Attorney, Agent, or Firm* — Park, Kim & Suh, LLC

(57) ABSTRACT

A semiconductor package includes a terminal pad having at least one first terminal lead structurally connected to the terminal pad, a semiconductor chip attached to an upper surface of the terminal pad by using a first adhesive, a heat radiation board attached to a lower surface of the terminal pad by using a second adhesive, and at least one second terminal lead electrically connected to the semiconductor chip. The second terminal lead is spaced apart from the terminal pad and is separated from the radiation board. The package further includes a metal clip electrically connecting the semiconductor chip to the second terminal lead, and a package housing covering parts of the first terminal lead, the second terminal lead, and the terminal pad. The package housing includes an adhesive spread space to expose the lower surface of the terminal pad.

18 Claims, 10 Drawing Sheets

(56) References Cited

FOREIGN PATENT DOCUMENTS

| | | | |
|---|---|---|---|
| KR | 10-0699746 B1 | 3/2007 | |
| KR | 10-0756303 B1 | 9/2007 | |
| KR | 10-2008-0070068 A | 7/2008 | |
| KR | 10-0940760 B1 | 2/2010 | |
| KR | 10-2010-0041889 A | 4/2010 | |
| KR | 10-2010-0087115 A | 8/2010 | |
| KR | 10-1115288 B1 | 3/2012 | |
| KR | 10-2012-0051902 A | 5/2012 | |
| KR | 10-2015-0097922 A | 8/2015 | |
| KR | 10-2016-0033870 A | 3/2016 | |
| KR | 20-2016-0003357 U | 9/2016 | |
| KR | 10-2019-0140238 A | 12/2019 | |
| KR | 102172689 B1 * | 11/2020 | ........ H01I 23/49579 |
| WO | 2009/048798 A1 | 4/2009 | |

* cited by examiner

SEMICONDUCTOR PACKAGE WITH HEAT RADIATION BOARD

CROSS-REFERENCE TO RELATED PATENT APPLICATION

This application claims the benefit of Korean Patent Application No. 10-2020-0014632, filed on Feb. 7, 2020, in the Korean Intellectual Property Office, the disclosure of which is incorporated herein in its entirety by reference.

BACKGROUND OF THE INVENTION

1. Field of the Invention

The present invention relates to a semiconductor package and a method of manufacturing the same, and more particularly, to a semiconductor package in which a heat radiation board is attached to a lower surface of a terminal pad to radiate heat generated from a semiconductor chip to the outside of a package housing without being adjacent to and passing through a terminal lead or a semiconductor chip and thereby, to efficiently cool the semiconductor chip and a method of manufacturing the semiconductor chip.

2. Description of the Related Art

Generally, in a package type power semiconductor device, a high-temperature environment is unnecessarily created due to power generated while the device is operated and thus, heat radiates. In this regard, it is important to cool the device in an appropriate level and to minimize thermal resistance.

As illustrated in FIG. 1, a conventional package type power semiconductor device includes a power semiconductor support 26 soldered to a direct bonded copper (DBC) board 28, wherein the DBC board 28 includes a support side (the first) copper layer 30, a ceramic layer 32, and a back side (the second) copper layer 34. Also, a sealing layer 36 is formed above a conducting wire 38 soldered 40 to the power semiconductor support 26, the DBC board 28, and the first copper layer 30.

However, the lead frame lead-in conducting wire 38 and the support side copper layer 30 are soldered and combined to each other so that bonding strength may be structurally lowered while in transformation due to a high-temperature environment. Also, the support side copper layer 30, which is a thermal diffusion layer, the ceramic layer 32, and the back side copper layer 34 are included and molded inside the sealing layer 36 and thus, there are limits in heat radiation effect. In addition, while in transformation due to a temperature change of a heat diffusion layer, the power semiconductor support 26 may be stressed and reliability of a semiconductor chip may be lowered.

Accordingly, technologies to efficiently radiate heat generated from a semiconductor chip to the outside of a package housing, to cool the semiconductor chip, and to minimize transformation of a semiconductor package are required.

SUMMARY OF THE INVENTION

The present invention provides a semiconductor package in which heat generated from a semiconductor chip is efficiently radiated to the outside of a package housing and is cooled, and transformation of a semiconductor package is minimized, and a method of manufacturing the same.

According to an aspect of the present invention, there is provided a semiconductor package including: a lead frame including at least one terminal pad and at least one first terminal lead structurally connected to the terminal pads; at least one semiconductor chip attached to the upper surfaces of the terminal pads by using a conductive first adhesive; at least one heat radiation board attached to the lower surfaces of the terminal pads by using a second adhesive; at least one second terminal lead electrically connected to the semiconductor chips, spaced apart from the terminal pads at regular intervals, and separated from the heat radiation boards; a metal clip electrically connecting the semiconductor chips to the second terminal leads and containing Cu or Al of more than 50 weight %; and a package housing covering parts of the first and second terminal leads, the semiconductor chips, and the terminal pads, wherein at least one of the terminal pads, the first terminal leads, and the second terminal leads contains Cu of more than 80 weight % or Al of more than 60 weight %.

According to another aspect of the present invention, there is provided a semiconductor package including: a lead frame comprising at least one terminal pad and at least one first terminal lead structurally connected to the terminal pads; at least one semiconductor chip attached to the upper surfaces of the terminal pads by using a conductive first adhesive; at least one heat radiation board attached to the lower surfaces of the terminal pads by using a second adhesive; at least one second terminal lead electrically connected to the semiconductor chips, spaced apart from the terminal pads at regular intervals, and separated from the heat radiation boards; and a package housing covering parts of the first and second terminal leads, the semiconductor chips, and the terminal pads, wherein the second terminal leads are directly attached to the semiconductor chips by using a conductive adhesive, and at least one of the terminal pads, the first terminal leads, and the second terminal leads contains Cu of more than 80 weight % or Al of more than 60 weight %.

Here, the second adhesive may be a non-conductive adhesive or a conductive adhesive.

The conductive adhesive may contain Sn of more than 40 weight %, or Ag or Cu of more than 50 weight %.

The heat radiation board may be an insulation board.

The heat radiation board may be a metal board.

At least one metal layer may be stacked and formed on the upper surface of the insulation board.

At least two metal layers may be stacked and formed on the upper surface of the insulation board and one metal layer may be stacked and formed on the lower surface of the insulation board.

At least three metal layers may be stacked and formed on the upper surface and the lower surface of the insulation board.

One insulation layer, or one insulation layer and at least one metal layer may be stacked and formed on the upper surface of the metal board.

The package housing may include an Epoxy Molding Compound (EMC), PolyPhenylene Sulfide (PPS), or polyButylene Terephtalate (PBT).

The heat radiation board may be attached to the surface of the package housing and thus, may be exposed to the outside of the package housing.

According to another embodiment of the present invention, there is provided a method of manufacturing a semiconductor package including: preparing a lead frame including at least one terminal pad and at least one first terminal lead structurally connected to the terminal pads; attaching at least one semiconductor chip to the upper surfaces of the terminal pads by using a conductive first adhesive; forming at least one second terminal lead electrically connected to the semiconductor chips and spaced apart from the terminal pads at regular intervals; electrically connecting the semiconductor chips to the second terminal leads by using a metal clip containing Cu or Al of more than 50 weight %; attaching at least one heat radiation board to the lower surfaces of the terminal pads by using a second adhesive; and forming a package housing covering parts of the first and second terminal leads, the semiconductor chips, and the terminal pads, wherein at least one of the terminal pads, the first terminal leads, and the second terminal leads contains Cu of more than 80 weight % or Al of more than 60 weight %.

According to another embodiment of the present invention, there is provided a method of manufacturing a semiconductor package including: preparing a lead frame including at least one terminal pad and at least one first terminal lead structurally connected to the terminal pads; attaching at least one semiconductor chip to the upper surfaces of the terminal pads by using a conductive first adhesive; forming at least one second terminal lead electrically connected to the semiconductor chips and spaced apart from the terminal pads at regular intervals; electrically connecting the semiconductor chips to the second terminal leads by using a metal clip containing Cu or Al of more than 50 weight %; forming a package housing covering parts of the first and second terminal leads, the semiconductor chips, and the terminal pads and forming a hollow adhesive spread space therein to expose the lower surfaces of the terminal pads; and attaching at least one heat radiation board to the adhesive spread space by using a second adhesive, wherein at least one of the terminal pads, the first terminal leads, and the second terminal leads contains Cu of more than 80 weight % or Al of more than 60 weight %.

According to another embodiment of the present invention, there is provided a method of manufacturing a semiconductor package including: preparing a lead frame including at least one terminal pad and at least one first terminal lead structurally connected to the terminal pads; attaching at least one semiconductor chip to the upper surfaces of the terminal pads by using a conductive first adhesive; forming at least one second terminal lead electrically connected to the semiconductor chips and spaced apart from the terminal pads at regular intervals; directly attaching the second terminal leads to the semiconductor chips by using a conductive adhesive; attaching at least one heat radiation board to the lower surfaces of the terminal pads by using a second adhesive; and forming a package housing covering parts of the first and second terminal leads, the semiconductor chips, and the terminal pads, wherein at least one of the terminal pads, the first terminal leads, and the second terminal leads contains Cu of more than 80 weight % or Al of more than 60 weight %.

According to another embodiment of the present invention, there is provided a method of manufacturing a semiconductor package including: preparing a lead frame including at least one terminal pad and at least one first terminal lead structurally connected to the terminal pads; attaching at least one semiconductor chip to the upper surfaces of the terminal pads by using a conductive first adhesive; forming at least one second terminal lead electrically connected to the semiconductor chips and spaced apart from the terminal pads at regular intervals; directly attaching the second terminal leads to the semiconductor chips by using a conductive adhesive; forming a package housing covering parts of the first and second terminal leads, the semiconductor chips, and the terminal pads and forming a hollow adhesive spread space therein to expose the lower surfaces of the terminal pads; and attaching at least one heat radiation board to the adhesive spread space by using a second adhesive, wherein at least one of the terminal pads, the first terminal leads, and the second terminal leads contains Cu of more than 80 weight % or Al of more than 60 weight %.

The heat radiation board that is same as or larger than the area of the adhesive spread space may be attached to the upper surface of the second adhesive and may be exposed to the outside of the package housing.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
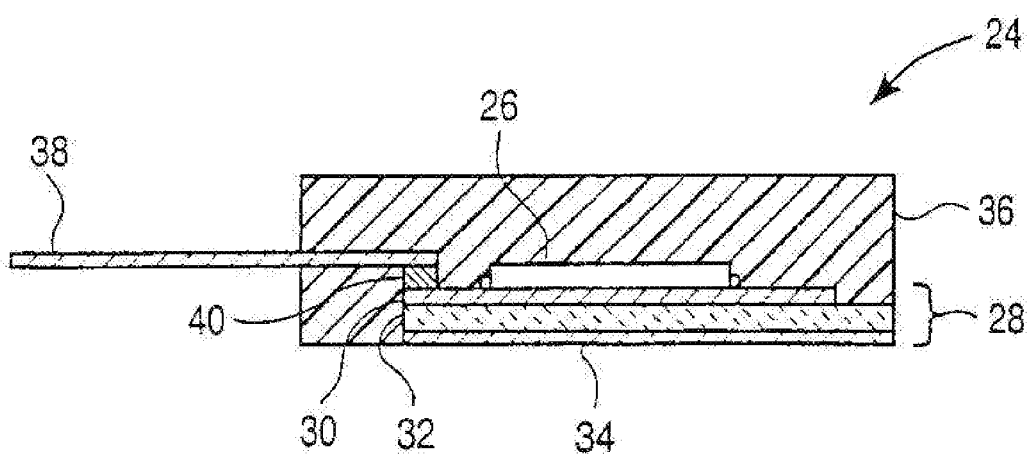
FIG. 1 illustrates a conventional package type power semiconductor device.

Hereinafter, the present invention will be described in more detail with reference to the accompanying drawings to be easily implemented by those of ordinary skill in the art. This invention may be embodied in many alternate forms and should not be construed as limited to only the exemplary embodiments set forth herein.

A semiconductor package according to an embodiment of the present invention includes a lead frame 110 including at least one terminal pad 111 and at least one first terminal lead 112 structurally connected to the terminal pads 111, at least one semiconductor chip 120 attached to the upper surfaces of the terminal pads 111 by using a first adhesive, at least one heat radiation board 130 attached to the lower surfaces of the terminal pads 111 by using a second adhesive 131, at least one second terminal lead 140 electrically connected to the semiconductor chips 120, spaced apart from the terminal pads 111 at regular intervals, and separated from the heat radiation boards 130, and a package housing 150 covering parts of the first terminal leads 112 and the second terminal leads 140, the semiconductor chips 120, and the terminal pads 111. Here, the heat radiation board 130 is attached to the terminal pad 111 so that heat generated from the semiconductor chip 120 may be radiated to the outside of the package housing 150 and thus, efficient cooling may be accomplished.

Hereinafter, the semiconductor package according to an embodiment of the present invention will be described below with reference to FIGS. 2A through 8C.

Firstly, as illustrated in FIGS. 2A through 3B, the lead frame 110 includes at least one terminal pad 111 on which the semiconductor chip 120 is placed, and the first terminal leads 112 structurally connected to the terminal pads 111, extended to the outside of the package housing 150, and exposed.

Here, the terminal pads 111 and the first terminal leads 112 may be formed as one body by using a metal including Cu of more than 80 weight % or Al of more than 60 weight %, are directly and electrically connected to the semiconductor chip 120, and need to secure terminals for electrical connection through the first terminal leads 112 exposed to the outside of the package housing 150.

Figure 3A:
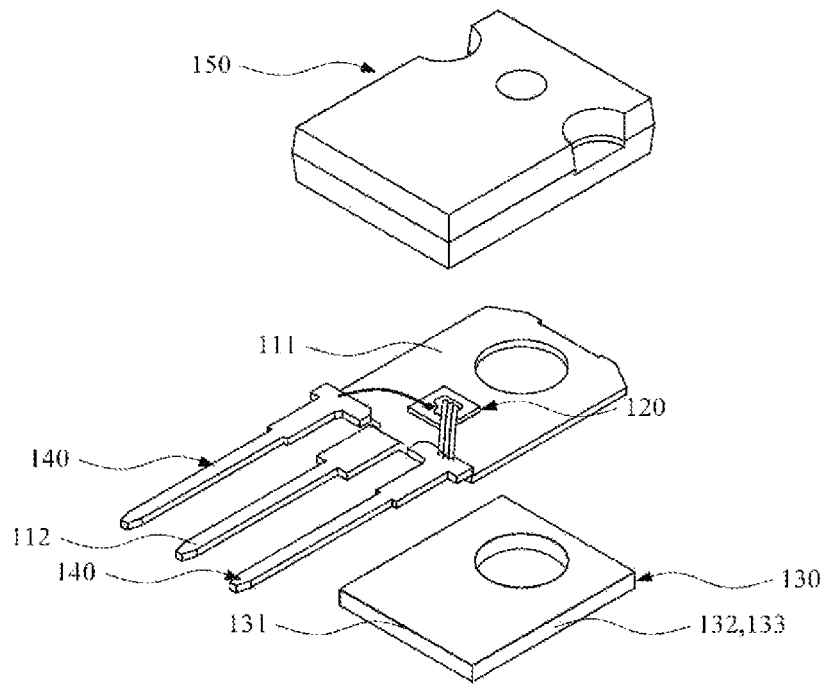
FIGS. 3A and 3B are exploded views of the semiconductor package of FIGS. 2A and 2B.
Figure 3B:
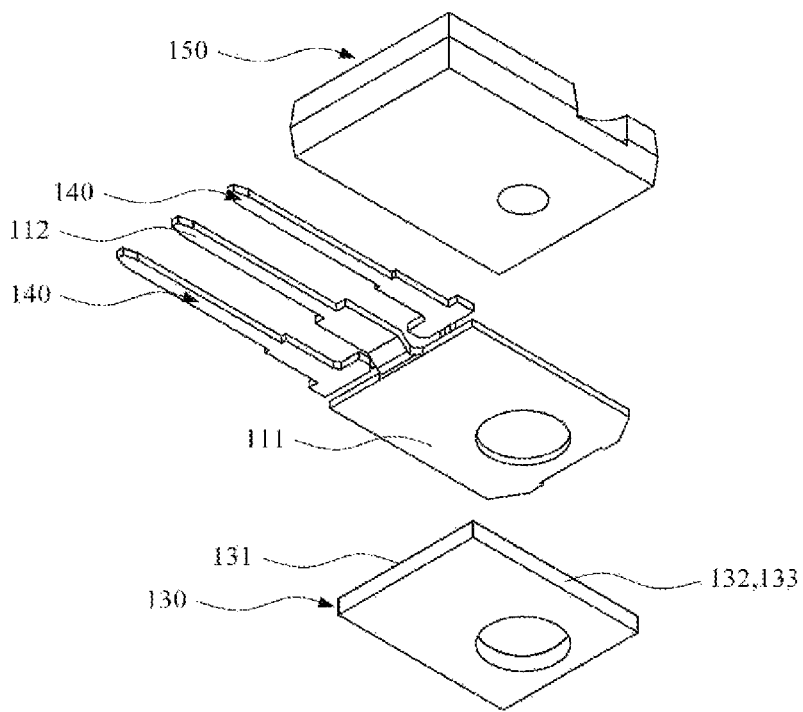

Next, as illustrated in FIGS. 3A and 3B, at least one semiconductor chip 120 is attached and placed on the upper surfaces of the terminal pads 111 by using the first adhesive (not illustrated).

For reference, the semiconductor chip 120 may include a silicon controlled rectifier (SCR), a power transistor, an insulated gate bipolar transistor (IGBT), a metal oxide semiconductor field effect transistor (MOSFET), a power rectifier, a power regulator, or a power semiconductor including a combination thereof.

Also, the first adhesive may be a conductive adhesive.

Next, as illustrated in FIGS. 3A and 3B, at least one heat radiation board 130 is attached to the lower surfaces of the terminal pads 111 by using the second adhesive 131 and transmits heat generated while the semiconductor chip 120 is operated, to the outside of the package housing 150.

Also, the heat radiation board 130 may include an insulation board 132 or a metal board 133 according to a size of the lead frame 110 or heating characteristics of the semiconductor chip 120, and the second adhesive 131 may be a non-conductive adhesive or a conductive adhesive.

Here, the conductive adhesive may include Sn of more than 40 weight %, or Ag or Cu of more than 50 weight %.

Figure 2A:
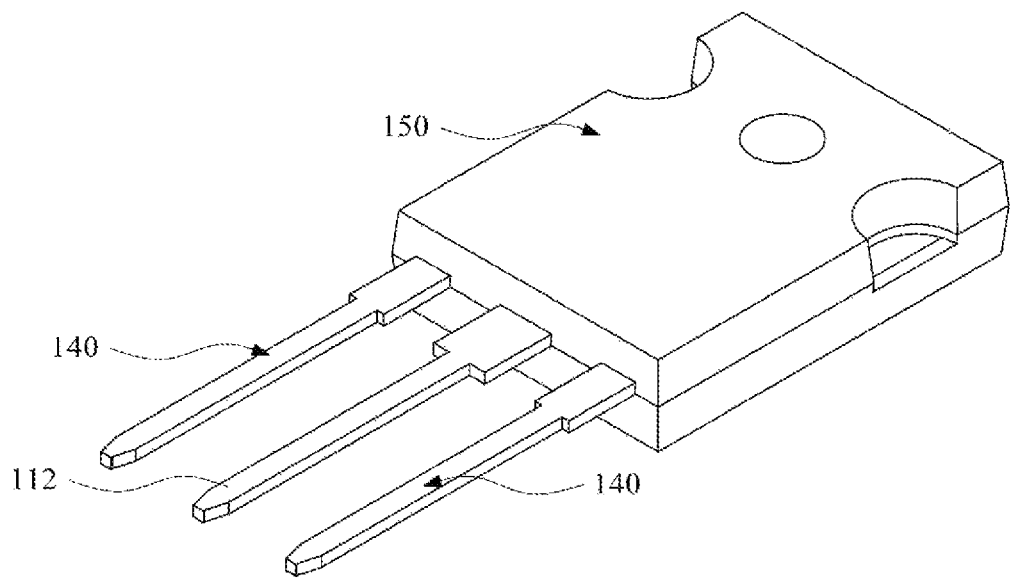
FIGS. 2A and 2B are perspective views of a semiconductor package according to an embodiment of the present invention.
Figure 2B:
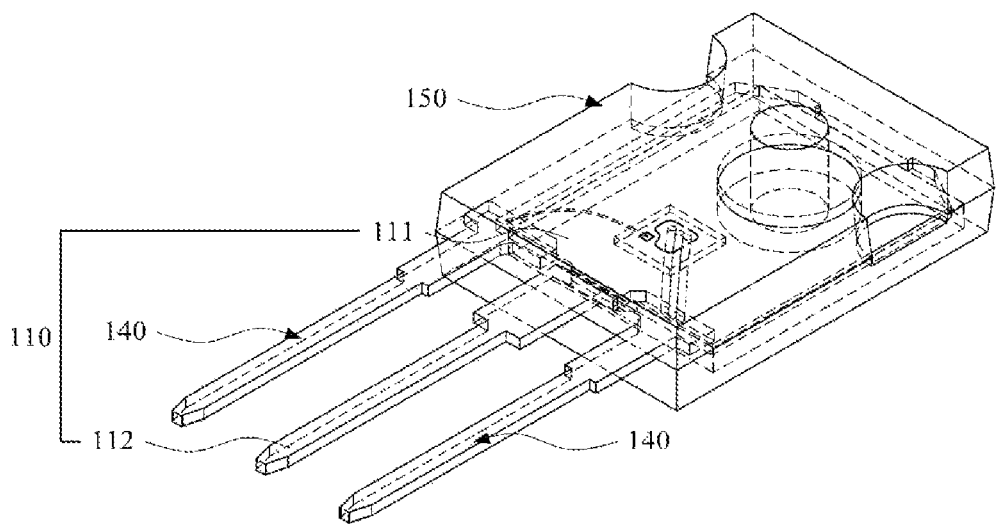
Figure 6A:
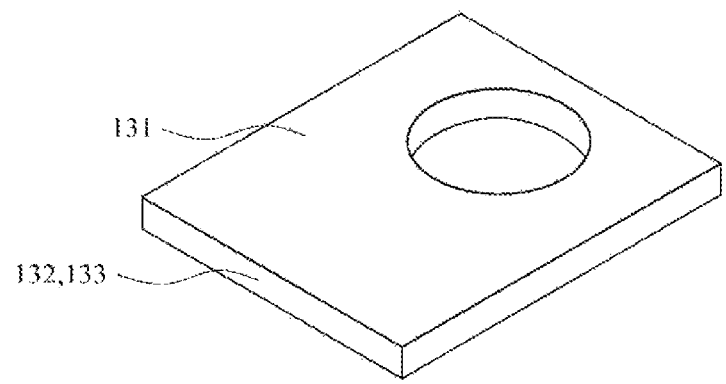
FIGS. 6A through 7C illustrate various structures of a heat radiation board of the semiconductor package of FIGS. 2A and 2B.
Figure 6B:
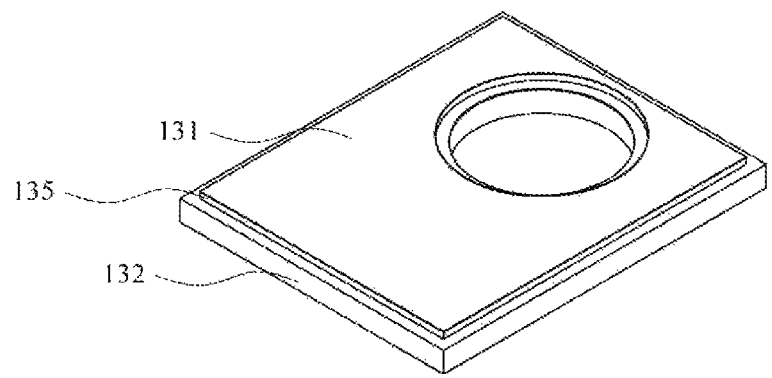
Figure 6C:
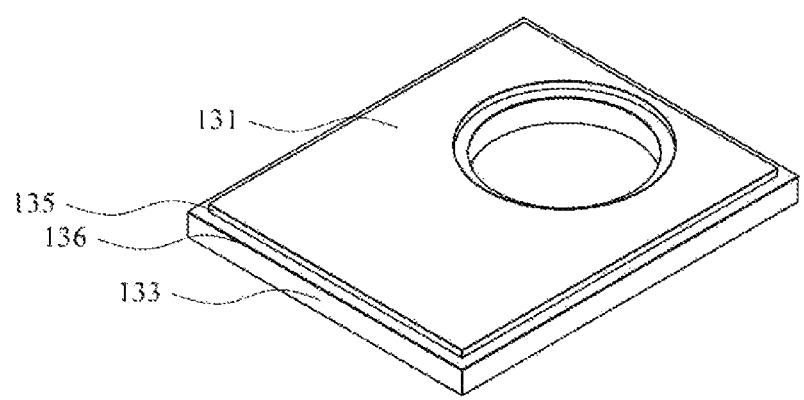

FIGS. 6A through 7C illustrate various structures of a heat radiation board of the semiconductor package of FIGS. 2A and 2B. As illustrated in FIG. 6A, the insulation board 132 or the metal board 133 is attached to the lower surface of the terminal pad 111 by using the second adhesive 131, as illustrated in FIGS. 6B and 7A, at least one metal layer 135, 135a, and 135b may be stacked and formed on the upper surface of the insulation board 132, as illustrated in FIG. 6C, one insulation layer 136 and at least one metal layer 135 may be stacked and formed on the upper surface of the metal board 133, or as not illustrated in the drawing, only one insulation layer may be formed on an upper surface of a metal board.

Figure 7A:
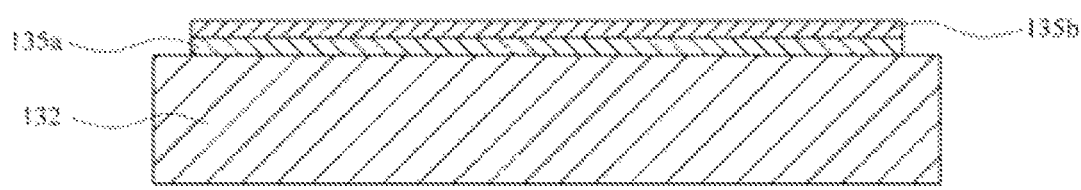
Figure 7B:
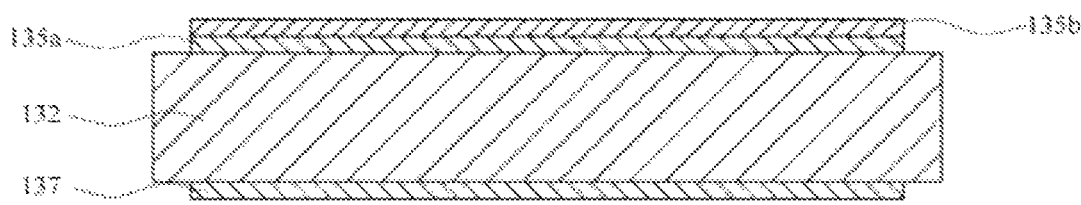
Figure 7C:
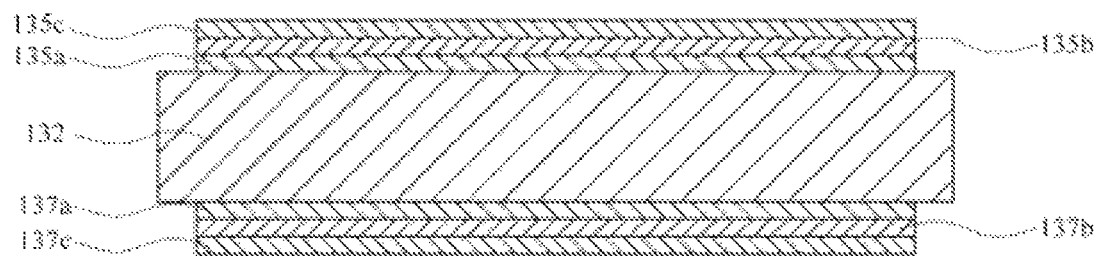

Also, as illustrated in FIG. 7B, at least two metal layers 135a and 135b are stacked and formed on the upper surface of the insulation board 132 and one metal layer 137 is formed on the lower surface of the insulation board 132, or as illustrated in FIG. 7C, at least three metal layers 135a, 135b, and 135c is stacked and formed on the upper surface of the insulation board 132 and at least three metal layers 137a, 137b, and 137c are stacked and formed on the lower surface of the insulation board 132.

Figure 4:
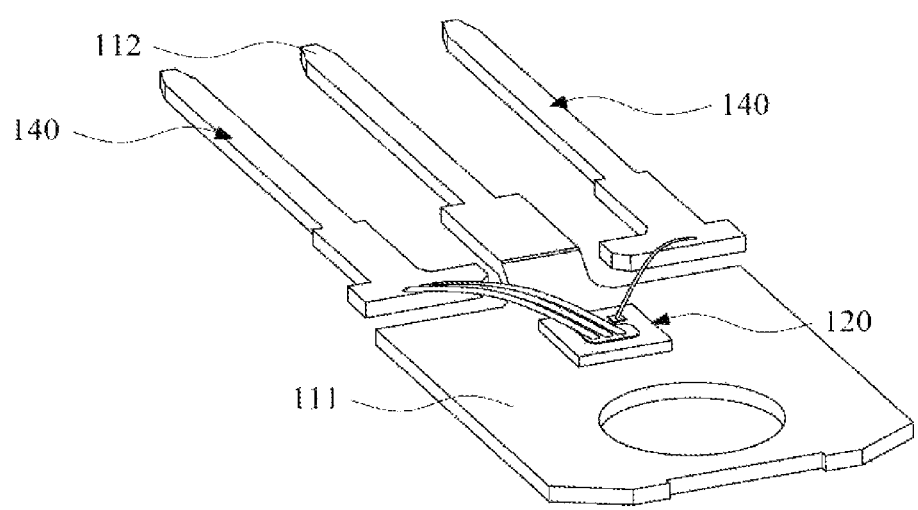
FIG. 4 is an exploded view of a lead frame of the semiconductor package of FIGS. 3A and 3B.
Figure 5:
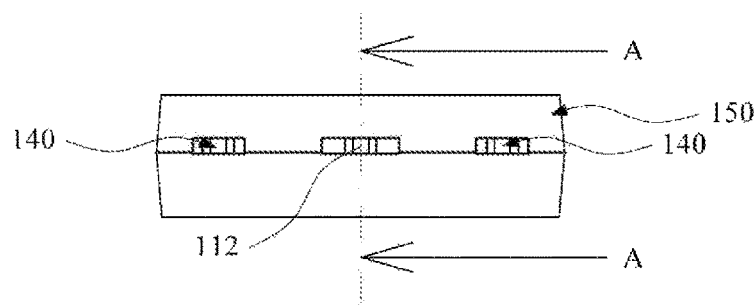
FIG. 5 is a cross-sectional view of the semiconductor package of FIGS. 2A and 2B.
Figure 5:
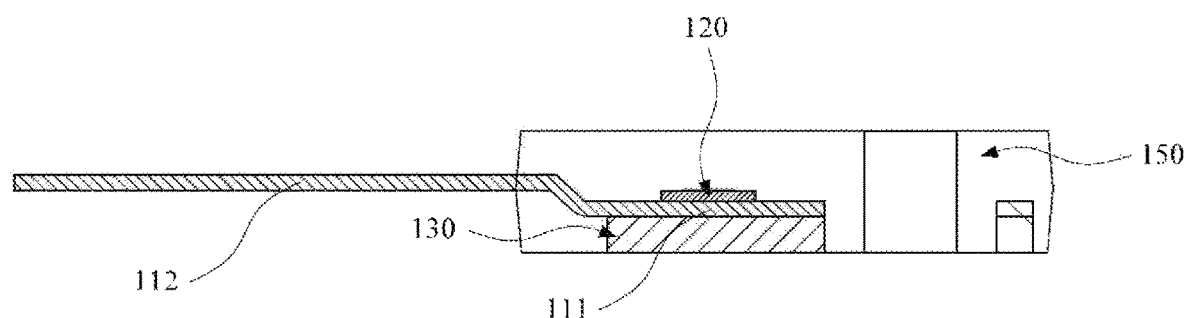

Next, as illustrated in FIGS. 3A through 4, at least one second terminal lead 140 is electrically connected to the semiconductor chip 120, spaced apart from the terminal pad 111 at a regular interval, structurally separated from the terminal pad 111, and separated and arranged not to directly contact the heat radiation board 130.

Here, the second terminal leads 140 may include Cu of more than 80 weight % or Al of more than 60 weight %.

Figure 8A:
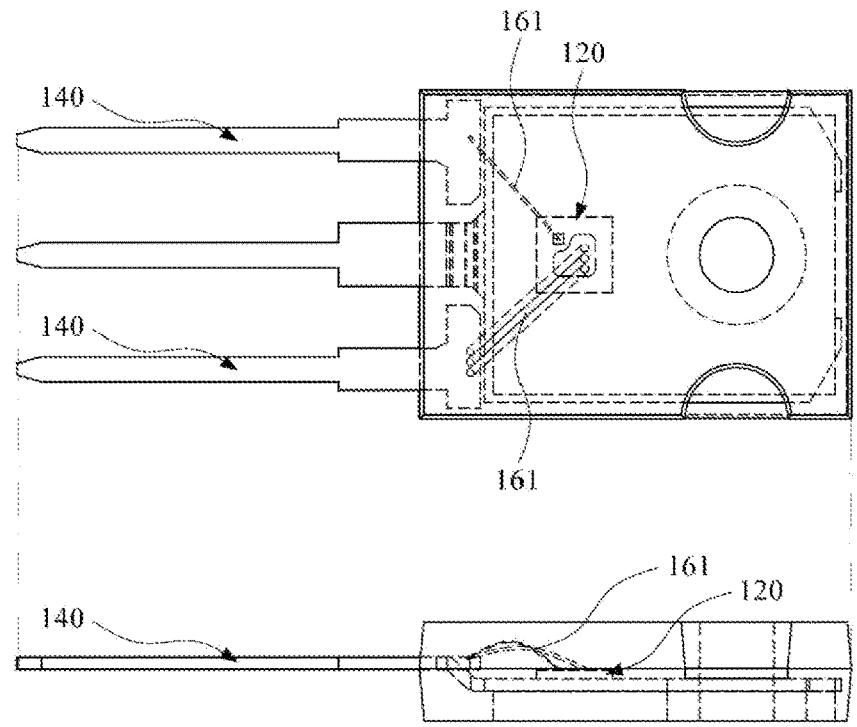
FIGS. 8A, 8B and 8C illustrate electrical connections of a semiconductor chip and a second terminal lead of the semiconductor package of FIGS. 2A and 2B.
Figure 8B:
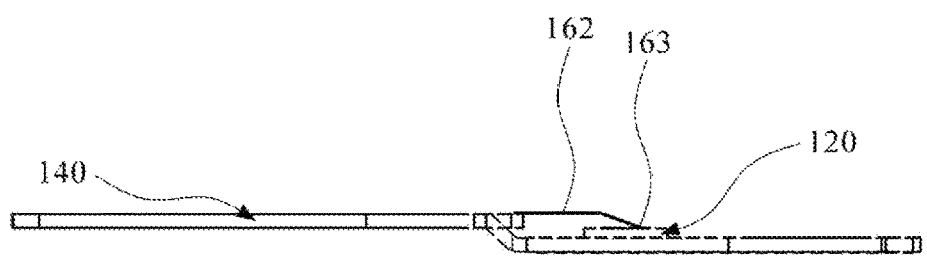
Figure 8C:
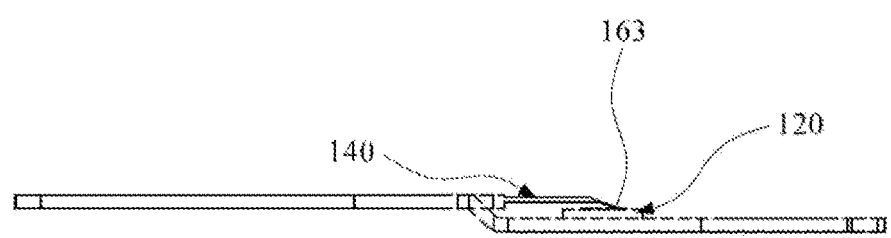

FIGS. 8A, 8B and 8C illustrate electrical connection of the semiconductor chip 120 and the second terminal leads 140 of the semiconductor package of FIGS. 2A and 2B. As illustrated in FIG. 8A, the semiconductor chip 120 and the second terminal leads 140 may be electrically connected to each other by using conductive wires 161 containing Au, Cu, or Al of more than 80 weight %. Also, in order to perform excellent properties in electrical connection, to facilitate heat release, and to improve thermal stability compared with the semiconductor package using the conductive wires 161, the semiconductor chip 120 and the second terminal leads 140 may be electrically connected to each other by using a metal clip 162 containing Cu or Al of more than 50 weight %, as illustrated in FIG. 8B. In addition, as illustrated in FIG. 8C, the second terminal leads 140 may be attached to the semiconductor chip 120 by using a conductive adhesive 163 and may be directly and electrically connected to the semiconductor chip 120.

Next, as illustrated in FIGS. 2A and 2B, the package housing 150 covers parts of the first terminal leads 112 and the second terminal leads 140, the semiconductor chip 120, and the terminal pad 111.

Here, the package housing 150 is an insulator including an Epoxy Molding Compound (EMC), PolyPhenylene Sulfide (PPS), or polyButylene Terephtalate (PBT).

Figure 9A:
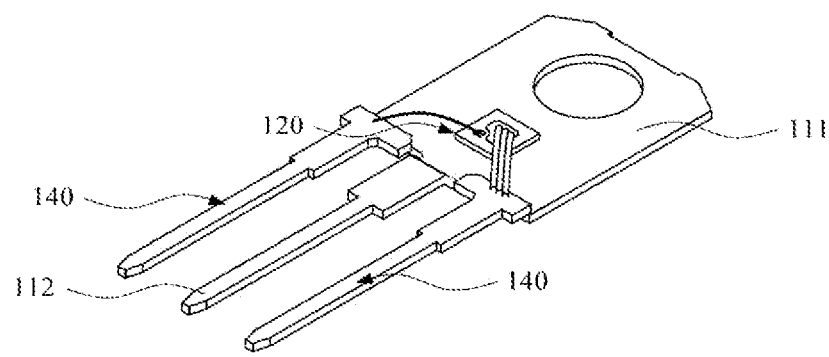
FIGS. 9A, 9B and 9C schematically illustrate flowcharts of a method of manufacturing a semiconductor package according to another embodiment of the present invention.
Figure 9B:
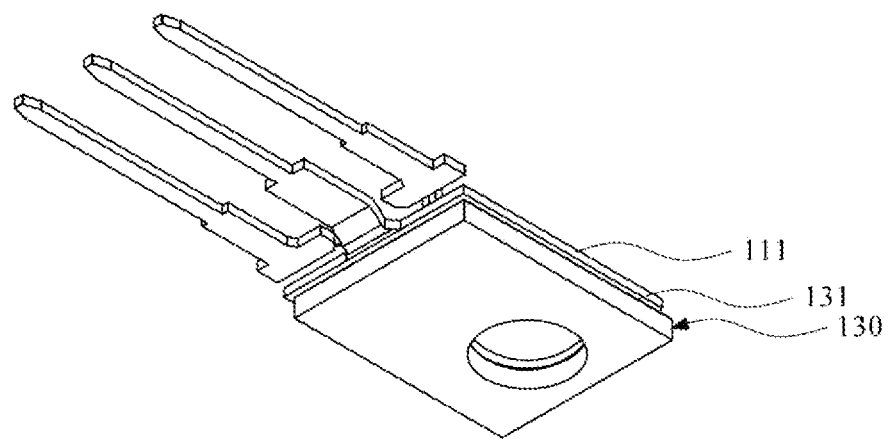
Figure 9C:
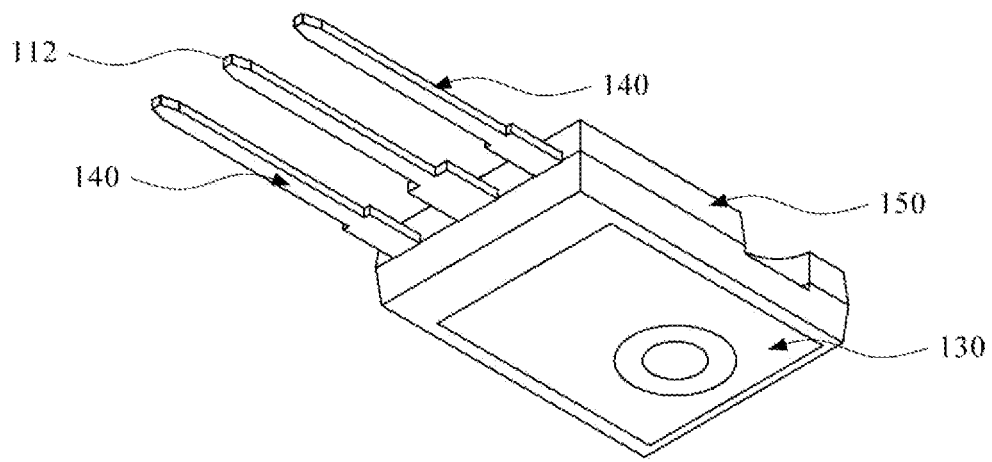

FIGS. 9A, 9B and 9C schematically illustrate flowcharts of a method of manufacturing a semiconductor package according to another embodiment of the present invention.

Referring to FIGS. 9A, 9B and 9C, the method of manufacturing a semiconductor package includes preparing the lead frame 110 including at least one terminal pad 111 and at least one first terminal lead 112 structurally connected to the terminal pads 111, attaching at least one semiconductor chip 120 to the upper surfaces of the terminal pads 111 by using a first adhesive, forming at least one second terminal lead 140 electrically connected to the semiconductor chips 120 and spaced apart from the terminal pads 111 at regular intervals (refer to 9A), attaching at least one heat radiation board 130 to the lower surfaces of the terminal pads 111 by using the second adhesive 131 (refer to FIG. 9B), and forming the package housing 150 to cover parts of the first terminal leads 112 and the second terminal leads 140, the semiconductor chips 120, and the terminal pads 111 (refer to FIG. 9C).

That is, before forming of the package housing 150 (a packaging process), the heat radiation board 130 is attached to the terminal pad 111 and then, the package housing 150 may be formed.

Here, as illustrated above, the semiconductor chip 120 and the second terminal leads 140 may be electrically connected to each other by using the conductive wires 161 containing Au, Cu, or Al of more than 80 weight %. Also, in order to perform excellent properties in electrical connection, to facilitate heat release, and to improve thermal stability compared with the semiconductor package using the conductive wires 161, the semiconductor chip 120 and the second terminal leads 140 may be electrically connected to each other by using the metal clip 162 containing Cu or Al of more than 50 weight %. In addition, the second terminal leads 140 may be attached to the semiconductor chip 120 by using the conductive adhesive 163 and may be directly and electrically connected to the semiconductor chip 120.

Figure 10A:
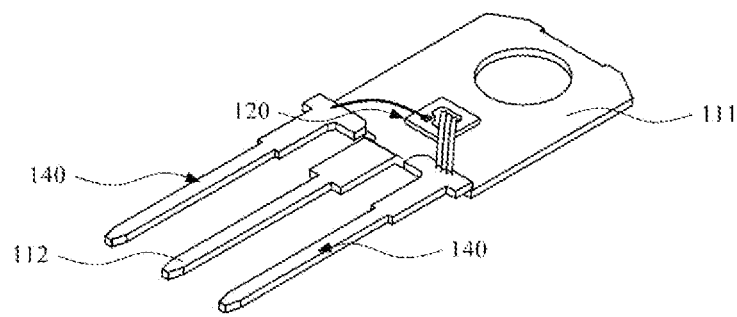
FIGS. 10A, 10B and 10C schematically illustrate flowcharts of a method of manufacturing a semiconductor package according to another embodiment of the present invention.
Figure 10B:
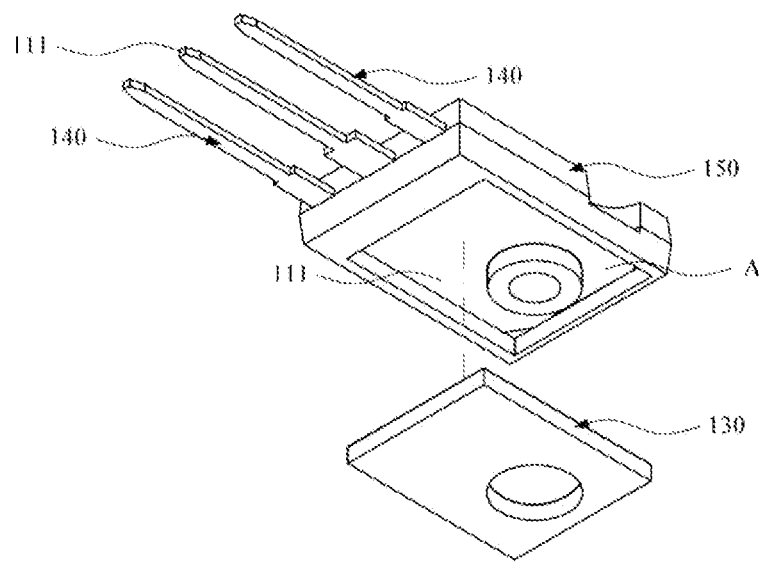
Figure 10C:
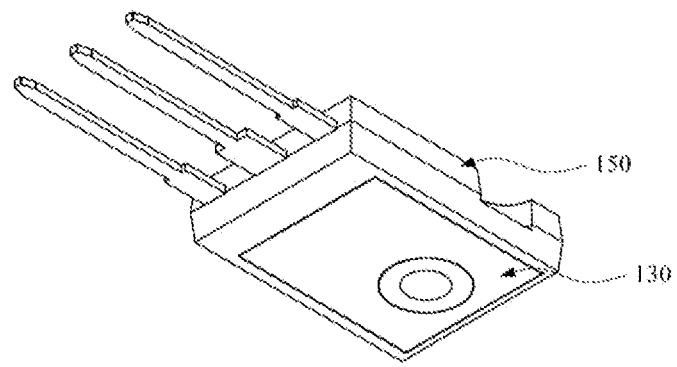

FIGS. 10A, 10B and 10C schematically illustrate flowcharts of a method of manufacturing a semiconductor package according to another embodiment of the present invention.

Referring to FIGS. 10A, 10B and 10C, the method of manufacturing a semiconductor package includes preparing the lead frame 110 including at least one terminal pad 111 and at least one first terminal lead 112 structurally connected to the terminal pads 111, attaching at least one semiconductor chip 120 to the upper surfaces of the terminal pads 111 by using a first adhesive, forming at least one second terminal lead 140 electrically connected to the semiconductor chips 120 and spaced apart from the terminal pads 111 at regular intervals (refer to 10A), forming the package housing 150 to cover parts of the first terminal leads 112 and the second terminal leads 140, the semiconductor chips 120, and the terminal pads 111 and to form an adhesive spread space A therein which is hollow to expose the lower surfaces of the terminal pads 111 (refer to FIG. 10B), and attaching at least one heat radiation board 130 to the adhesive spread space A by spreading the second adhesive 131 into the adhesive spread space A (refer to FIG. 10C).

That is, before forming of the package housing 150 (a packaging process), the heat radiation board 130 may be attached to the terminal pad 111. Here, at least one terminal pad 111 may be exposed to the outside of the package housing 150 and then, the heat radiation board 130 may be attached to the terminal pad 111 by using the second adhesive.

For example, during a process of forming the package housing 150, the hollow adhesive spread space A is formed to expose the lower surfaces of the terminal pads 111, an adhesive is spread into the adhesive spread space A so that the heat radiation board 130 does not enter into the adhesive spread space A, the heat radiation board 130 that is same as or larger than the area of the adhesive spread space A is attached to the upper surface of the adhesive, and then, the terminal pad 111 may be exposed to the outside of the package housing 150.

Here, as illustrated above, the semiconductor chip 120 and the second terminal leads 140 may be electrically connected to each other by using the conductive wires 161 containing Au, Cu, or Al of more than 80 weight %. Also, in order to perform excellent properties in electrical connection, to facilitate heat release, and to improve thermal stability compared with the semiconductor package using the conductive wires 161, the semiconductor chip 120 and the second terminal leads 140 may be electrically connected to each other by using the metal clip 162 containing Cu or Al of more than 50 weight %. In addition, the second terminal leads 140 may be attached to the semiconductor chip 120 by using the conductive adhesive 163 and may be directly and electrically connected to the semiconductor chip 120.

According to the semiconductor package and the method of manufacturing the same described above, the heat radiation board is attached to the lower surfaces of the terminal pads so that heat generated from the semiconductor chip is radiated to the outside of the package housing without being adjacent to and passing through the terminal leads or the semiconductor chip and thus, the semiconductor chip may be efficiently cooled. Also, the heat radiation board is attached to the surface of the package housing so that the semiconductor package may be prevented from being transformed after completion of molding and thus, reliability and electrical properties may be stably secured.

According to the present invention, the heat radiation board is attached to the lower surfaces of the terminal pads so that heat generated from the semiconductor chip is radiated to the outside of the package housing without being adjacent to and passing through the terminal leads or the semiconductor chip and thus, the semiconductor chip may be efficiently cooled.

In addition, the heat radiation board is attached to the surface of the package housing so that the semiconductor package may be prevented from being transformed after completion of molding and thus, reliability and electrical properties may be stably secured.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package comprising:
   a lead frame comprising at least one terminal pad and at least one first terminal lead structurally connected to the at least one terminal pad;
   at least one semiconductor chip attached to an upper surface of the at least one terminal pad by using a first adhesive;
   at least one heat radiation board attached to a lower surface of the at least one terminal pad by using a second adhesive;
   at least one second terminal lead electrically connected to the at least one semiconductor chip, spaced apart from the at least one terminal pad at regular intervals, and separated from the at least one heat radiation board;
   a metal clip electrically connecting the at least one semiconductor chip to the at least one second terminal lead and containing Cu or Al of more than 50 weight %; and
   a package housing covering parts of the at least one first terminal lead and the at least one second terminal lead, the at least one semiconductor chip, and the at least one terminal pad,
   wherein at least one of the at least one terminal pad, the at least one first terminal lead, and the at least one second terminal lead contains Cu of more than 80 weight % or Al of more than 60 weight %,
   wherein the package housing comprises an adhesive spread space which is a hollow to expose the lower surface of the at least one terminal pad, the second adhesive is spread into the adhesive spread space at a height that is same as a height of the hollow, the at least one heat radiation board that is same as or larger than an area of the adhesive spread space is attached to an upper surface of the second adhesive, and the at least one heat radiation board is exposed to the outside of the package housing.

2. A semiconductor package comprising:
   a lead frame comprising at least one terminal pad and at least one first terminal lead structurally connected to the at least one terminal pad;
   at least one semiconductor chip attached to an upper surface of the at least one terminal pad by using a first adhesive;

at least one heat radiation board attached to a lower surface of the at least one terminal pad by using a second adhesive;

at least one second terminal lead electrically connected to the at least one semiconductor chip, spaced apart from the at least one terminal pad at regular intervals, and separated from the at least one heat radiation board; and a package housing covering parts of the at least one first terminal lead and the at least one second terminal lead, the at least one semiconductor chip, and the at least one terminal pad, wherein the at least one second terminal lead is directly attached to the at least one semiconductor chip by using a third adhesive, and at least one of the at least one terminal pad, the at least one first terminal lead, and the at least one second terminal lead contains Cu of more than 80 weight % or Al of more than 60 weight %, wherein the package housing comprises an adhesive spread space which is a hollow to expose the lower surface of the at least one terminal pad, the second adhesive is spread into the adhesive spread space at a height that is same as a height of the hollow, the at least one heat radiation board that is same as or larger than an area of the adhesive spread space is attached to an upper surface of the second adhesive, and the at least one heat radiation board is exposed to the outside of the package housing.

3. The semiconductor package of claim 1, wherein the second adhesive is a conductive adhesive.

4. The semiconductor package of claim 2, wherein the second adhesive is a conductive adhesive.

5. The semiconductor package of claim 3, wherein the second adhesive contains Sn of more than 40 weight %, Ag of more than 50 weight % or Cu of more than 50 weight %.

6. The semiconductor package of claim 4, wherein the second adhesive contains Sn of more than 40 weight %, Ag of more than 50 weight %, or Cu of more than 50 weight %.

7. The semiconductor package of claim 1, wherein the at least one heat radiation board is an insulation board or a metal board.

8. The semiconductor package of claim 2, wherein the at least one heat radiation board is an insulation board or a metal board.

9. The semiconductor package of claim 1, wherein the at least one heat radiation board is an insulation board and at least one metal layer is stacked and formed on an upper surface of the insulation board.

10. The semiconductor package of claim 2, wherein the at least one heat radiation board is an insulation board and at least one metal layer is stacked and formed on an upper surface of the insulation board.

11. The semiconductor package of claim 1, wherein the at least one heat radiation board is an insulation board, at least two first metal layers are stacked and formed on an upper surface of the insulation board, and a second metal layer is stacked and formed on a lower surface of the insulation board.

12. The semiconductor package of claim 2, wherein the at least one heat radiation board is an insulation board, at least two first metal layers are stacked and formed on an upper surface of the insulation board, and a second metal layer is stacked and formed on a lower surface of the insulation board.

13. The semiconductor package of claim 1, wherein the at least one heat radiation board is an insulation board, at least three first metal layers are stacked and formed on an upper surface of the insulation board, and at least three second metal layers are stacked and formed on a lower surface of the insulation board.

14. The semiconductor package of claim 2, wherein the at least one heat radiation board is an insulation board, at least three first metal layers are stacked and formed on an upper surface of the insulation board, and at least three second metal layers are stacked on formed on a lower surface of the insulation board.

15. The semiconductor package of claim 1, wherein the at least one heat radiation board is a metal board, and an insulation layer and at least one metal layer are stacked and formed on an upper surface of the metal board.

16. The semiconductor package of claim 2, wherein the at least one heat radiation board is a metal board, and an insulation layer and at least one metal layer are stacked and formed on an upper surface of the metal board.

17. The semiconductor package of claim 1, wherein the at least one heat radiation board is attached to a surface of the package housing and thus, is exposed to the outside of the package housing.

18. The semiconductor package of claim 2, wherein the at least one heat radiation board is attached to a surface of the package housing and thus, is exposed to the outside of the package housing.

* * * * *